(12) United States Patent
Chang et al.

(10) Patent No.: US 6,287,882 B1
(45) Date of Patent: Sep. 11, 2001

(54) LIGHT EMITTING DIODE WITH A METAL-COATED REFLECTIVE PERMANENT SUBSTRATE AND THE METHOD FOR MANUFACTURING THE SAME

(75) Inventors: Kuo-Hsiung Chang, Tao-Yuan Hsien; Kun-Chuan Lin, Taipei; Ray-Hua Horng, Chang-Hua Hsien; Man-Fang Huang, Hsinchu Hsien; Dong-Sing Wuu, Hsinchu; Sun-Chin Wei, Tai-Nan Hsien, all of (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 0 days.

(21) Appl. No.: 09/411,945

(22) Filed: Oct. 4, 1999

(51) Int. Cl.[7] .................................................. H01L 21/00
(52) U.S. Cl. .............................................................. 438/29
(58) Field of Search ................................ 438/29, 46, 458, 438/459, 970, 977; 257/98

(56) References Cited

U.S. PATENT DOCUMENTS

| | | |
|---|---|---|
| 4,570,172 | 2/1986 | Henry et al. . |
| 5,008,718 | 4/1991 | Fletcher et al. . |
| 5,233,204 | 8/1993 | Fletcher et al. . |
| 5,237,587 | 8/1993 | Schoolcraft . |
| 5,376,580 | 12/1994 | Kish et al. . |
| 5,923,951 | * 7/1999 | Goossen et al. ....................... 438/47 |

* cited by examiner

Primary Examiner—Keith Christianson (57) ABSTRACT

A method of manufacturing a light emitting diode (LED) includes growing a light emitting region on a temporary substrate, bonding a metal-coated reflective permanent substrate and then removing the temporary substrate. The reflective metal layer also serves as a bonding agent for bonding the permanent substrate. The bonded LED element and permanent substrate are heated in a wafer bonding tool that includes a graphite lower chamber and a graphite upper cover with a stainless steel screw. Because of the different thermal expansion coefficients between stainless and graphite, the stainless steel screw applies a pressure to the bonded structure during the heating process to assist the bonding of the permanent substrate.

13 Claims, 7 Drawing Sheets

LIGHT EMITTING DIODE WITH A METAL-COATED REFLECTIVE PERMANENT SUBSTRATE AND THE METHOD FOR MANUFACTURING THE SAME

FIELD OF THE INVENTION

The present invention relates to a light emitting diode (LED) with a metal-coated reflective permanent substrate and the method for manufacturing the same.

BACKGROUND OF THE INVENTION

Figure 1:
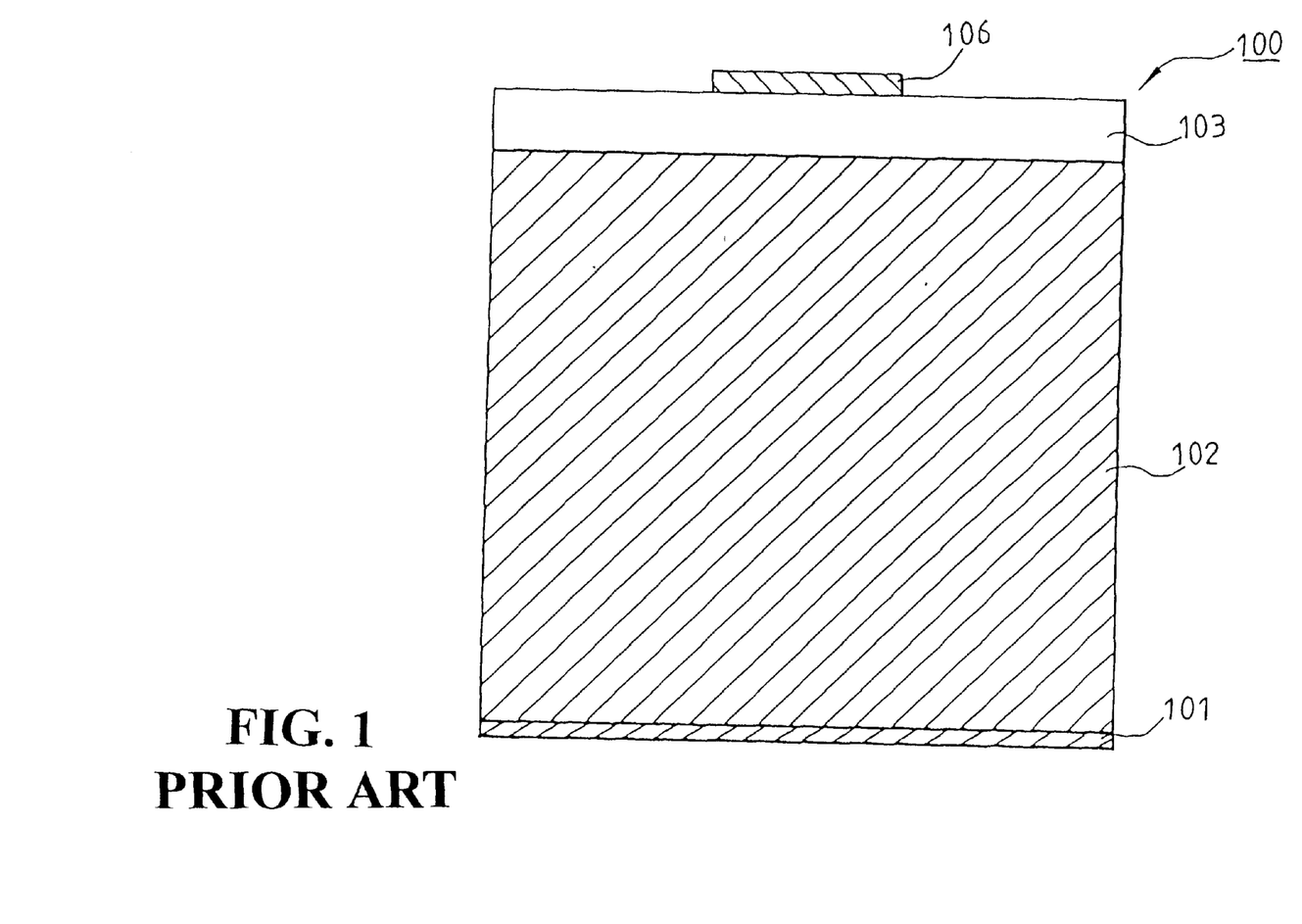
FIG. 1 is a cross sectional view of a conventional light emitting diode.

A cross sectional view of a conventional light emitting diode is illustrated in FIG. 1. The light emitting diode 100 includes a semiconductor substrate 102, a first ohmic contact electrode 101 formed on the rear side of the semiconductor substrate 102, a light generating region 103 formed on the semiconductor substrate 102, and a second ohmic contact electrode 106 formed on the light generating region 103. The light generating region 103 is formed by a P-type region and an N-type region, and grown on the gallium arsenide (GaAs) substrate 102. Because of the current crowding effect, limited emitting angle of the light and light absorption of the substrate, the illumination in this light emitting diode is not strong.

The crystal lattice constants in most of the light generating region 103 are matched with that of the gallium arsenide substrate. Namely, the light emitting diode of visible light is directly fabricated on the gallium arsenide substrate 102. However, since the energy gap of gallium arsenide is 1.43 eV which is smaller than that of the visible light and the light emitted from the diode is isotropic, part of the light enters the substrate and is absorbed by the gallium arsenide substrate.

Figure 2:
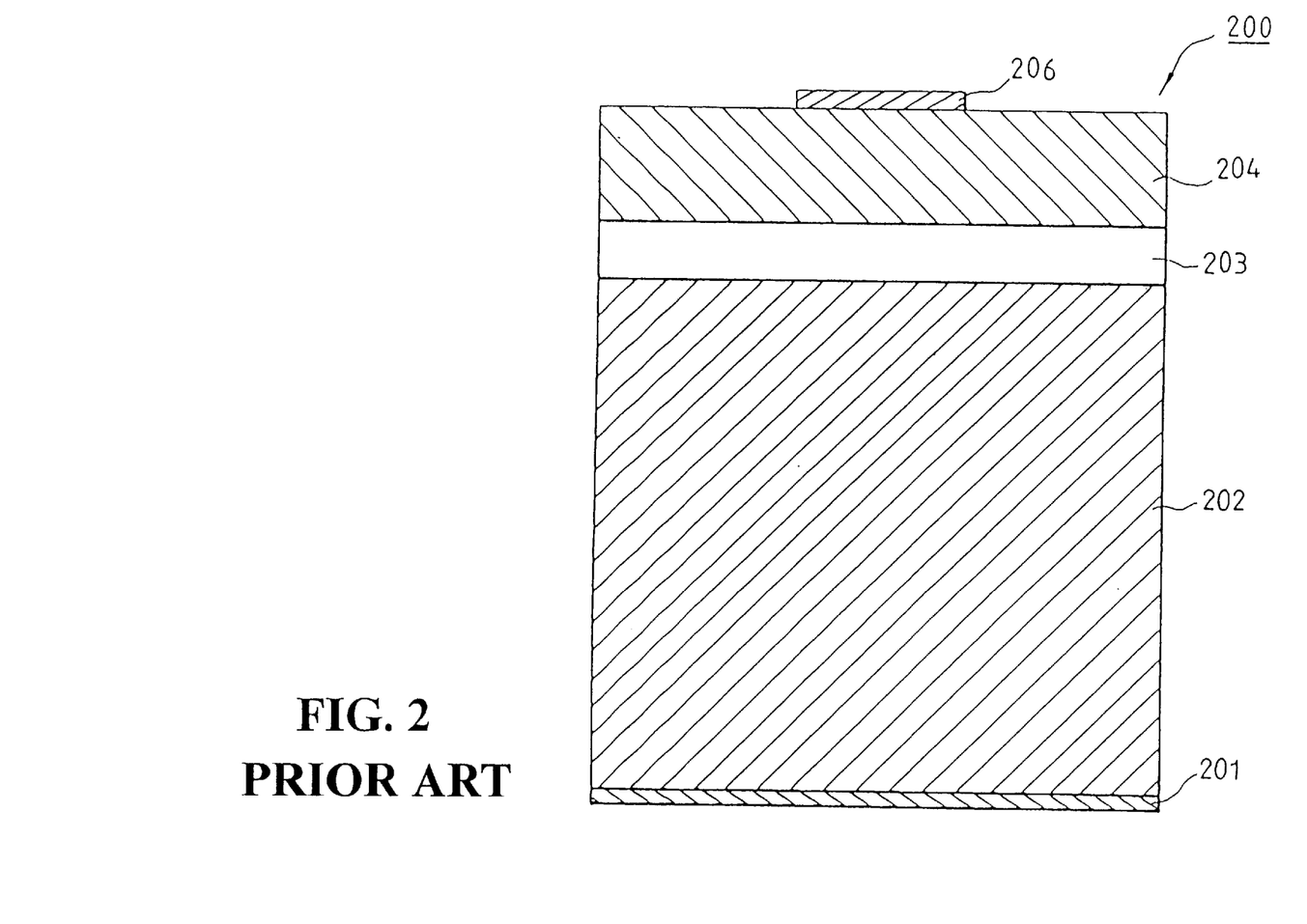
FIG. 2 is a cross sectional view of a conventional light emitting diode having a transparent window layer.

U.S. Pat. Nos. 5,008,718 and 5,233,204 disclose a transparent window layer structure for increasing the output light of a light emitting diode. Referring to FIG. 2, the structure of the light emitting diode 200 is formed by a transparent window layer 204 grown on the light emitting diode 100 shown in FIG. 1. By means of the transparent window layer, the current crowding effect in a conventional light emitting diode is reduced and the current spread to emit light is increased. As a result, the illumination of the light emitting diode is enhanced.

The proper material for the transparent window layer 204 includes GaP, GaAsP, and AlGaAs, etc., whose energy gap is larger than those of the materials in the AlGaInP light generating region. Under this condition, the critical angle of the emitted light can be increased and the current crowding effect is reduced so as to enhance the illumination of the light emitting diode. However, in the electric property, since the materials on the uppermost layer of the transparent window layer 204 and the AlGaInP light generating region have a hetero junction, the energy gap difference causes the positive forward bias voltage $V_f$ of the light emitting diode to increase. As a result, the power consumption of the light emitting diode is increased.

Figure 3:
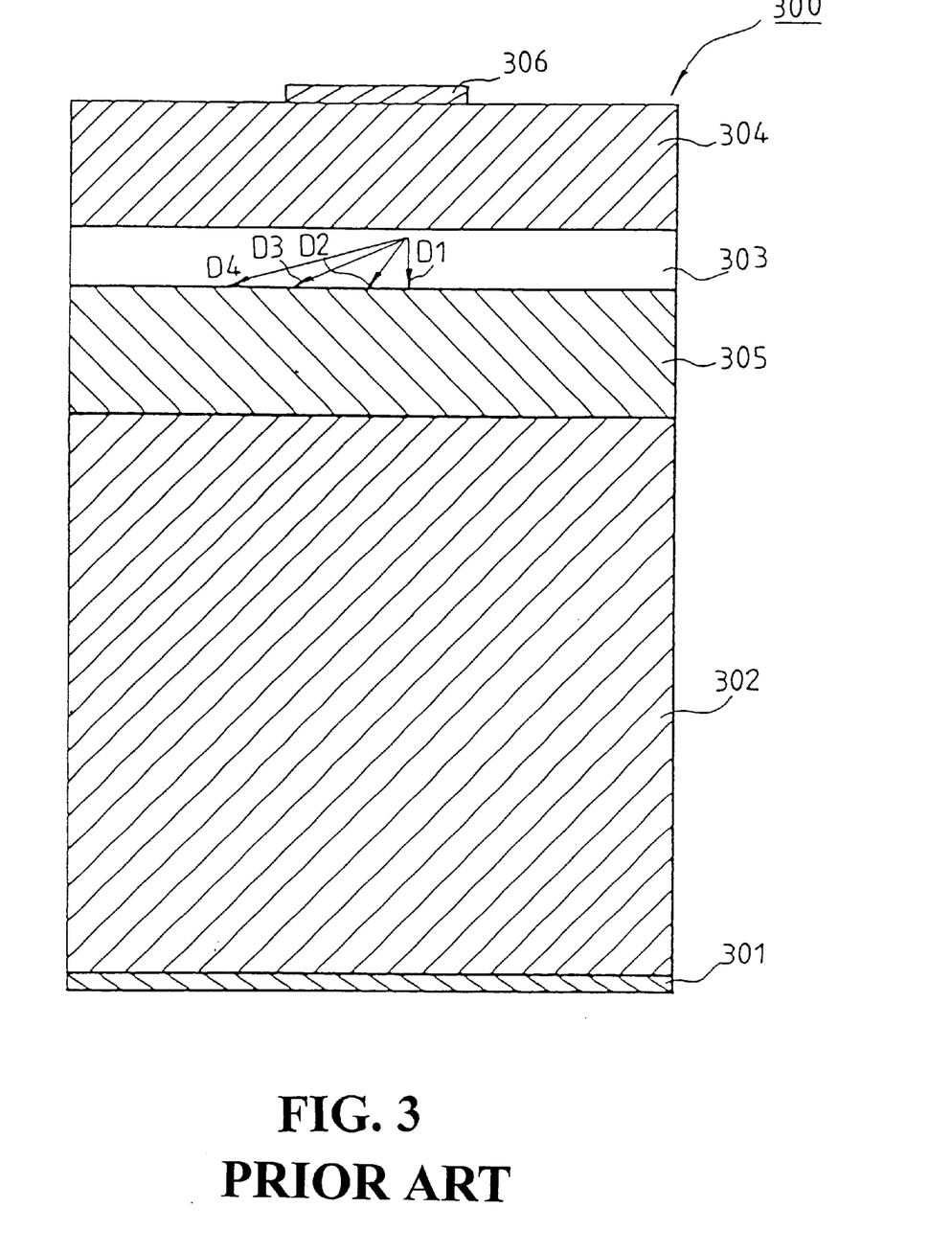
FIG. 3 shows a light emitting diode having a conventional multilayer reflector structure.

U.S. Pat. Nos. 5.237,581 and 4,570,172 disclose a light emitting diode 300 with a multilayer reflecting structure, as shown in FIG. 3. The structure of FIG. 3 includes a semiconductor substrate 302, a lower multilayer reflector 305 formed on the semiconductor substrate 302, a light generating region 303 formed on the lower multilayer reflector 305, an upper multilayer reflector 304 formed on the light generating region 303, a first ohmic contact electrode 306 on the upper multilayer reflector 304, and a second ohmic contact electrode 301 formed on the rear side of the semiconductor substrate 302. By means of the semiconductor multilayer reflector, namely, a distributed Bragg reflector (DBR), the light transmitting to the substrate is reflected backwards so as to be emitted out of the light emitting diode. Accordingly, the light illumination is increased.

In this prior art light emitting diode, the lower multilayer reflector 305 serves to reflect 90% of the light emitted from the light generating region to the light absorption substrate, while the upper multilayer reflector serves to guide light to the upper surface of the light emitting diode. Therefore, the problem of light absorption by the substrate is alleviated, and the problem related to limited critical angle is also improved. However, since the multilayer reflector has many hetero junctions, the effect of energy gap difference is enlarged and hence the forward bias $V_f$ is increased. As a consequence, although the DBR structure disclosed in U.S. Pat. Nos. 5,237,581 and 4,570,172 can reflect the light impinging on the substrate, the DBR structure has a high reflectivity only for normal incident light (shown in D1 of FIG. 3). For oblique incident light (such as D2, D3, and D4 shown in FIG. 3) the reflectivity is decreased. Thus the improvement to the illumination of a light emitting diode in visible light band is limited, whereas the DBR structure increases difficulty in growing the thin film epitaxial layer and thus the fabrication cost.

U.S. Pat. No. 5,376,580 discloses a light emitting diode with wafer bonding, wherein a gallium arsenide substrate serves as a temporary substrate to grow a light emitting diode structure including a confinement layer, an active layer and another confinement layer. Then the light emitting diode structure is adhered to a transparent substrate, and the GaAs substrate is removed. Therefore, the problem of light absorption by a substrate can be solved completely. Because the transparent substrate disclosed in the prior art is made of GaP, a thick GaP window layer is needed to handle thin epitaxial layers properly. Consequently, the LED device is relatively thin after the GaAs substrate is removed because of the thick window layer. The light emitting diode becomes easier to break and more difficult to fabricate. Furthermore, the wafer bonding needs to be processed in high temperature for a long period of time (about 600~700° C. for at least one hour), which results in degraded p-n junction and inferior diode performance.

SUMMARY OF THE INVENTION

Accordingly, the object of the present invention is to provide a method for manufacturing a light emitting diode with a metal-coated reflective permanent substrate. The optical properties of this permanent substrate are not relevant because light is reflected before reaching the substrate. The reflective mirror on the permanent substrate is made of metal and employed as a bonding agent. An LED element is adhered to the permanent substrate with this reflective mirror. After being adhered, an etching agent is used to remove the GaAs substrate. Therefore, the problem of light absorption by the substrate is reduced, and the drawback of the p-n junction being affected by high temperature and long process duration is eliminated completely. The illumination can thus be greatly enhanced.

Another object of the present invention is to provide a light emitting diode structure combined with a metal-coated reflective permanent substrate. The light emitting region of the light emitting diode can be any conventional structure. For example, it may be a light emitting region with a double hetero structure including an upper cladding layer, an active layer and a lower cladding layer, a light emitting region with a single hetero structure, or a light emitting region of a homostructure. The permanent substrate with a metal-coated reflective mirror of the present invention can be applied to all kinds of conventional light emitting regions and thus it has wide applications.

A further object of the present invention is to provide a process for manufacturing a light emitting diode with a metal-coated reflective permanent substrate. The process comprises the steps of selecting a temporary substrate to grow a light emitting region and form an LED element; selecting a permanent substrate to bond the LED element to the permanent substrate by a reflective metal bonding agent, removing the temporary substrate adhered by the permanent substrate/LED element by mechanic grinding or chemical etching; fabricating a plane LED element with the permanent substrate, and forming ohmic contact electrodes on the plane LED element. According to the present invention, the illumination of a light emitting diode is enhanced.

It is also an object of the present invention to provide a wafer bonding tool used to bond the LED element to the permanent substrate, wherein two materials with different thermal expansion coefficients provide pressures to the LED element and the permanent substrate. The feature of the present invention is that a stainless steel screw is used to replace a quartz sleeve. Since the thermal expansion coefficient of the stainless steel is larger than that of graphite, in the process of high temperature bonding, the stainless steel screw applies pressure to the clamped object.

The various objects and advantages of the present invention will be more readily understood from the following detailed description when read in conjunction with the appended drawing.

DETAILED DESCRIPTION OF THE PREFERRED EMBODIMENTS

Figure 5:
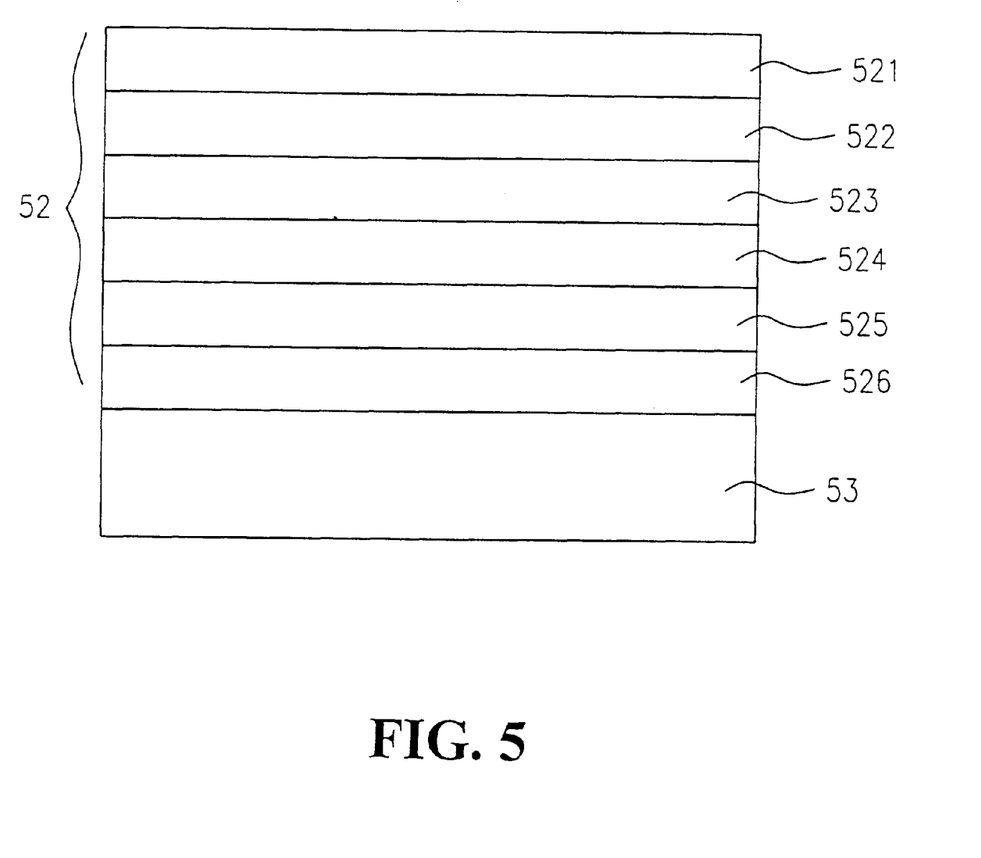
FIG. 5 is a cross sectional view of the LED element of one embodiment according to the present invention.
Figure 6:
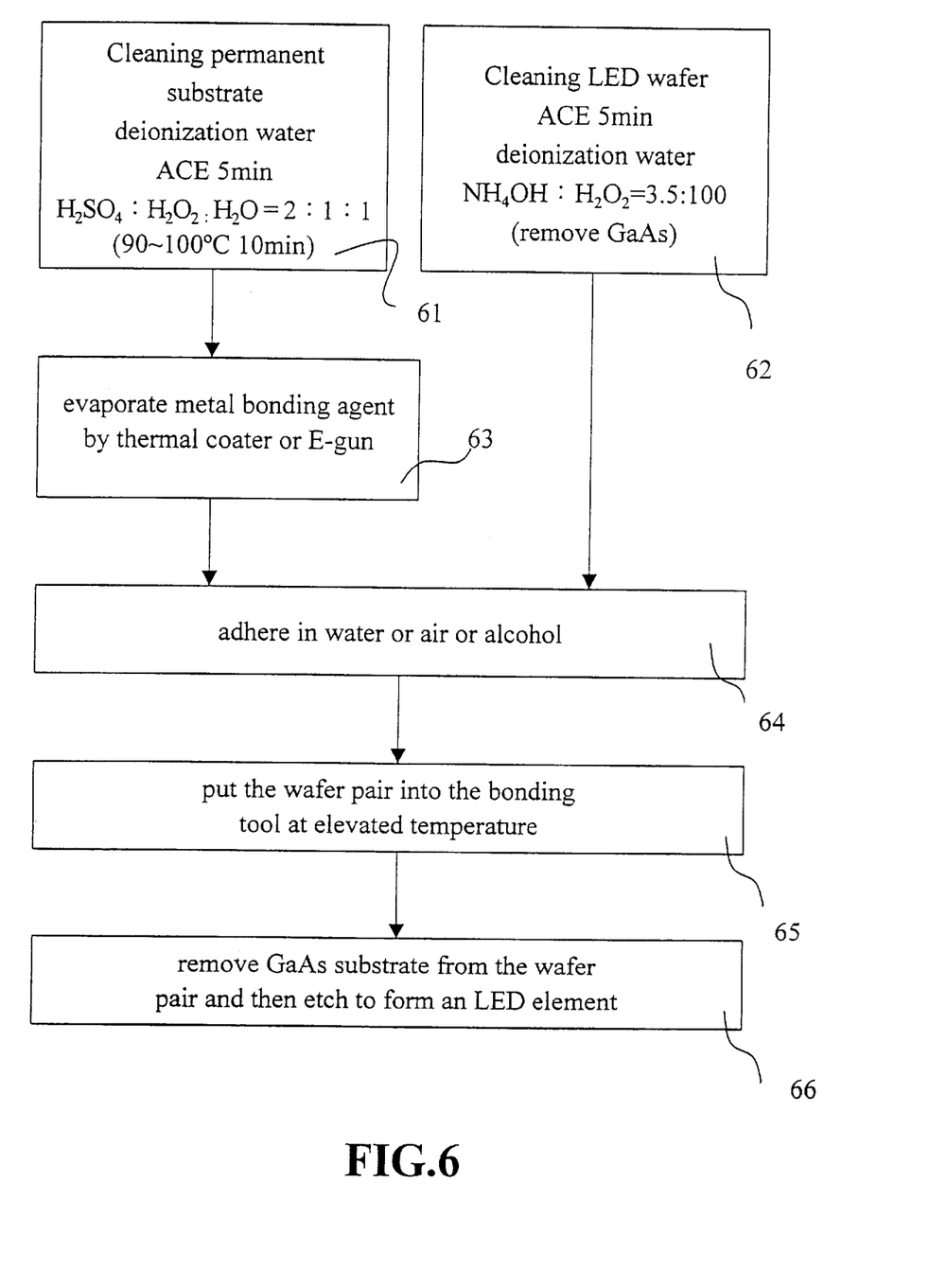
FIG. 6 shows the flow diagram of the LED element of the present invention being adhered to a permanent substrate with a reflective mirror.

In the present invention, an LED element is first grown on a temporary substrate. The LED element is also adhered to a permanent substrate with a metal reflective mirror. The temporary substrate is then removed so that the light emitted from the LED element will not be absorbed by the substrate for enhancing the illumination of the emitted light. The LED element using the technology of the present invention is shown in FIG. 5. The flow diagram of the process for bonding the LED element to a metal-coated reflective permanent substrate is shown in FIG. 6. It should be noted that the removal of the temporary substrate occurs after the LED element has been bonded to the metal-coated reflective permanent substrate. Therefore, the need of thick epitaxial layers is avoided.

Figure 4A:
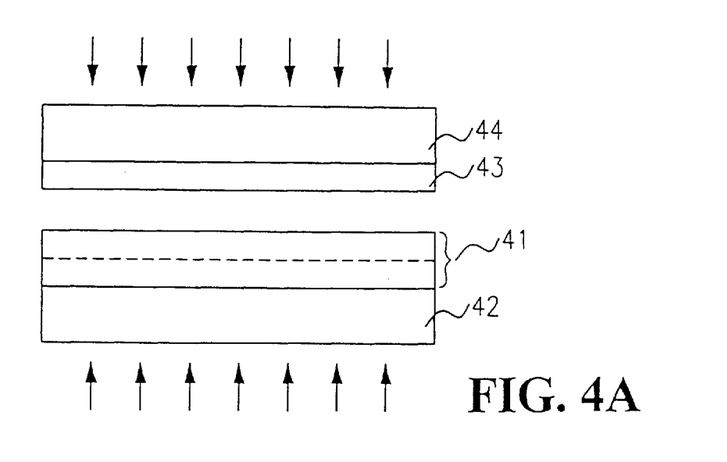
FIGS. 4A–4D are the flow diagram of manufacturing the light emitting diode of the present invention by adhering an LED element to a metal-coated reflective permanent substrate.
Figure 4B:
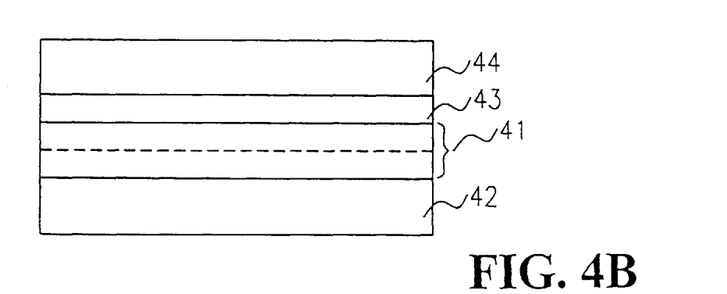
Figure 4C:
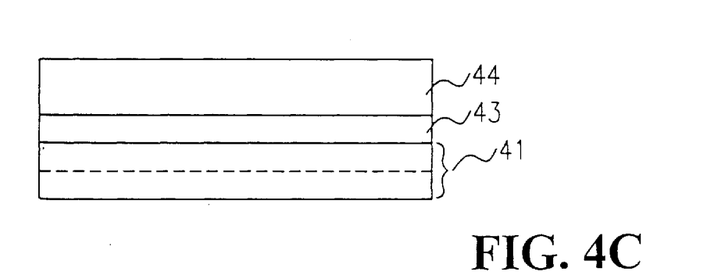
Figure 4D:
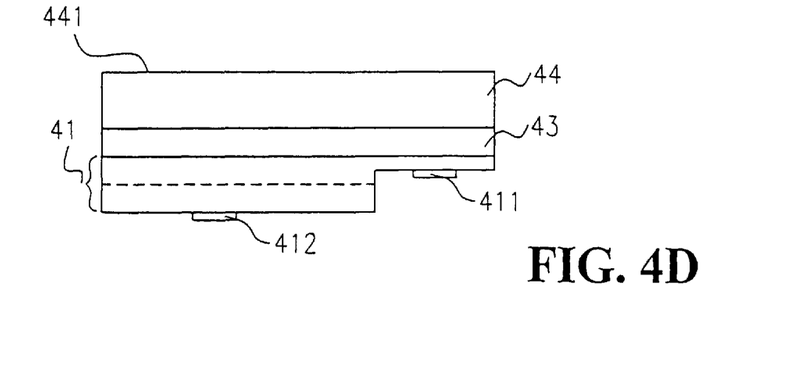

The manufacturing process in the present invention for an LED element with a metal-coated reflective permanent substrate comprises the steps of:

(A) Selecting a temporary substrate 42 to grow a light emitting region 41 on the temporary substrate 42 for forming an LED element as shown in FIG. 4A;

(B) Selecting a permanent substrate 44 coated with a metal reflective mirror 43, and adhering the LED element to the permanent substrate 44 by using a metal bonding agent as shown in FIG. 4B;

(C) Removing the temporary substrate 42 by mechanic grinding or chemical etching as shown in FIG. 4C;

(D) Manufacturing a plane LED element with a permanent substrate 44;

(E) Forming ohmic contact electrodes 411 and 412 on the plane LED element as shown in FIG. 4D; and (F) Etching the plane LED element 41 to the metal bonding agent 43 and substituting the ohmic contact electrode 411 with the metal bonding agent 43 if the material of the metal bonding agent 43 is identical to that of the ohmic contact electrode 411, such as an alloy of gold and beryllium (AuBe).

The temporary substrate is selected from GaAs or InP. The permanent substrate is selected from materials with high thermal conductivity, such as Si, GaAs and $Al_2O_3$. SiC, GaP, BN, AlN, glass, quartz or metal may also be used as the permanent substrate. The optical properties of the permanent substrate are not relevant because light is reflected before reaching the substrate. The metal bonding agent is selected from the group of indium (In), tin (Sn), aluminum (Al), gold (Au), platinum (Pt), titanium (Ti), zinc (Zn), silver (Ag), palladium (Pd), gold-beryllium (AuBe), gold-germanium-nickel (AuGeNi), and lead-tin (Pb—Sn) alloys, etc. The etching agent is formed from hydrochloric acid and phosphoric acid. The LED element may have a p/n junction or n/p junction. An etching stop layer 525 as shown in FIG. 5 is formed between the light emitting region and the substrate so that the substrate can be removed effectively. The material of the etching stop layer is primarily formed by material resisting the etching solution of the substrate and is different from that of the substrate. Examples of the etching stop layer are $In_xGa_{1-x}P$ or $Al_xGa_{1-x}As$.

The technical detail of manufacturing the light emitting diode according to the invention are described in the following:

(1) Before bonding the LED element (41 and 42) to the permanent substrate 44, the permanent substrate 44 is cleaned first. The permanent substrate 44 is put into acetone and cleaned by an ultrasonic cleaner for 5 minutes to remove the dust of the permanent substrate 44. If the permanent substrate is not made of any metal or alloy, it is cleaned by $H_2SO_4$ under a temperature of 90~100° C. for about 10 minutes to remove the organic objects or heavy metal on the permanent substrate 44. Then the metal reflective mirror (metal bonding agent) 43 is deposited by thermal or electronic gun evaporation. This metal serves as a bonding layer and a mirror at the same time. In one embodiment of the present invention, the detailed structure of the LED element is illustrated in FIG. 5.

(2) Before bonding the LED element to the permanent substrate, the contamination on the surface of the LED element needs to be cleaned first. The LED element is placed into acetone and then cleaned using an ultrasonic cleaner for 5 minutes to remove dust. Thereafter, the oxidized layer on the surface of the LED element is removed by buffered HF.

Figure 7:
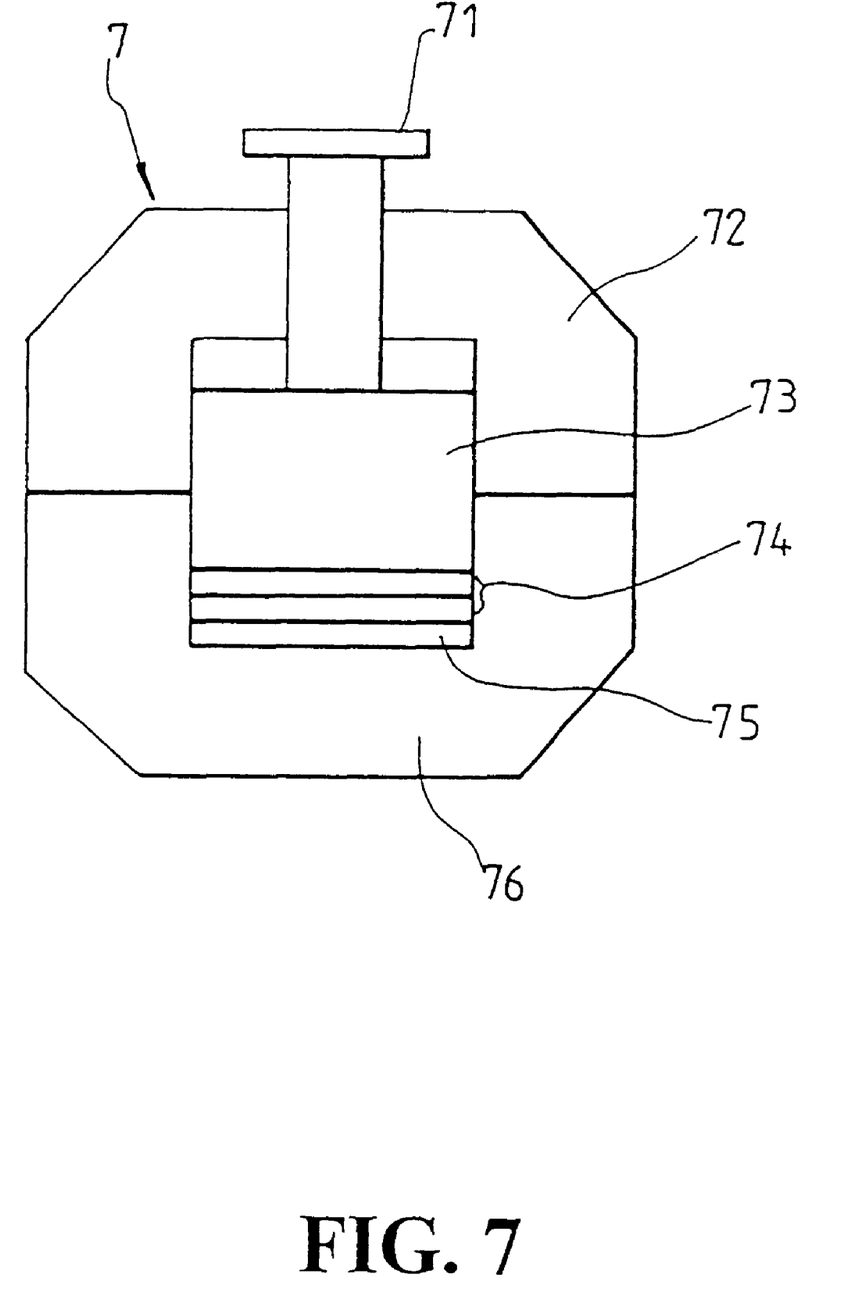
FIG. 7 is a cross sectional view of the wafer bonding tool of the present invention.

(3) The cleaned LED element is bonded to the permanent substrate 44 coated with the metal bonding agent 43 in air or alcohol. The structure is shown in FIG. 4A. The LED element and the permanent substrate 44 are then put into a wafer bonding tool as shown in FIG. 7.

(4) The LED elements 41 and 42 and the permanent substrate 44 coated with the metal bonding agent 43 are thermally processed under a temperature ranging from 300~450° C. for about 5~10 minutes, and then naturally cooled down. The structure is shown in FIG. 4B.

(5) The temporary GaAs substrate 42 is removed from the processed sample (LED element and the permanent substrate coated with the metal bonding agent 43) by mechanic grinding or chemical etching using an etching agent ($NH_4OH:OH_2O_2$). The structure is shown in FIG. 4C.

(6) The p/n region of the LED element is patterned by a selective etching process, namely, etching a p-type AlGaInP or n-type AlGaInP by $HCl:H_3PO_4$. The structure shown in FIG. 4D is then achieved.

(7) Plane electrodes 411 and 412, namely, ohmic contact electrodes of p-type AlGaInP or n-type AlGaInP are formed.

A cross sectional view of an embodiment of the present invention is illustrated in FIG. 5. The LED element comprises a light emitting region 52 and a GaAs substrate 53. The GaAs substrate may be an n+, p+ or Si-GaAs substrate. The light emitting region includes a heavily doped GaAs contact layer 521 with a thickness of 0.1–0.3 $\mu$m, an AlGaInP upper cladding layer 522 with a thickness of 0.2–1 $\mu$m, an AlGaInP active layer 523 with a thickness of 0.2–1 $\mu$m, an AlGaInP lower cladding layer 524 with a thickness of 0.2–1 $\mu$m, an AlAs etching stop layer 525 with a thickness of 0.1 $\mu$m, and a GaAs buffer layer 526. The LED light emitting region 52 has a p/i/n structure and or an n/i/p structure. AlAs serves as an etching stop layer and may be replaced by $Al_xGa_{1-x}As$ or $In_xGa_{1-x}P$.

The flow diagram of bonding the LED element to a permanent substrate is shown in FIG. 6. A permanent substrate is cleaned firstly (step 61). Then, an LED wafer is washed (step 62). Next, the metal bonding agent 43 is evaporated and coated on the permanent substrate using a thermal coater or electron gun (step 63). The LED element is bonded to the permanent substrate in water, air or alcohol (step 64). The bonded structure (wafer pair) is placed in a wafer bonding tool and thermally processed (step 65). The GaAs temporary substrate is removed from the wafer pair and then it is etched to form a plane LED element (step 66).

The cross sectional view of the wafer bonding tool of the present invention is illustrated in FIG. 7. The wafer bonding tool includes a stainless steel screw 71, a graphite upper cover 72, a graphite pillar 73, a graphite shim 75, and a graphite lower chamber 76. A wafer pair (i.e., permanent substrate and LED wafer) 74 is clamped therein. Due to different thermal expansion coefficients of two materials in this wafer bonding tool, the two pieces of the wafer pair are pressed so as to be fused with each other at a higher temperature. The feature of the bonding tool of the present invention is that a stainless steel screw serves to substitute for a quartz sleeve, since the thermal expansion coefficient of the stainless is larger than that of graphite, during high temperature bonding, the stainless steel will apply an axial pressure to the wafer pair.

The advantages and effects of the present invention are:

(1) In the present invention, a permanent substrate with a reflective mirror is used to replace the conventional light absorbing substrate (such as GaAs) or colored substrate (such as GaP). The optical properties of the substrates are not relevant because light is reflected before reaching the substrate. Therefore, the illumination and hue of the LED are improved.

(2) In the present invention, the thermal treatment is performed in lower temperature (about 300~450° C.) for about 5 to 10 minutes for providing the energy for bonding, thus the original p-n junction of LED is not affected. Further, the contamination and re-distribution of the impurity profile do not occur under such a lower temperature.

(3) The wafer bonding tool used in the present invention is shown in FIG. 7, wherein two materials with different thermal expansion coefficients provide pressures to the LED element and permanent substrate, and thus the applied pressure can be measured by a twisting spanner.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for manufacturing an LED with a metal-coated reflective permanent substrate, comprising:
   (A) selecting a temporary substrate to grow an LED structure on said temporary substrate;
   (B) selecting a permanent substrate with a reflective mirror and bonding said LED structure to said permanent substrate by a metal bonding agent;
   (C) removing said temporary substrate using mechanic grinding or chemical etching;
   (D) manufacturing a plane LED element with a metal-coated reflective permanent substrate; and
   (E) forming two ohmic contact electrodes on said plane LED element.

2. The method for manufacturing an LED with a metal-coated reflective permanent substrate as claimed in claim 1, wherein step (E) of forming two ohmic contact electrodes is accomplished by etching away a portion of a light emitting region of said plane LED element to expose a portion said metal bonding agent as a first ohmic contact electrode and depositing a second ohmic contact electrode on the top of said plane LED element.

3. The method for manufacturing an LED with a metal-coated reflective permanent substrate as claimed in claim 1, wherein said reflective mirror serves as said metal bonding agent.

4. The method for manufacturing an LED with a metal-coated reflective permanent substrate as claimed in claim 1, wherein the material of said reflective mirror is selected from the group of In, Sn, Al, Au, Pt, Ti, Ag, Pd, AuBe, AuGeNi, and PbSn.

5. The method for manufacturing an LED with a metal-coated reflective permanent substrate as claimed in claim 1, wherein said temporary substrate is selected from the group of GaAs and InP.

6. The method for manufacturing an LED with a metal-coated reflective permanent substrate as claimed in claim 1, wherein said permanent substrate is selected from the group of Si, GaAs, $Al_2O_3$, SiC, GaP, BN, AlN, glass, quartz and metal.

7. The method for manufacturing an LED with a metal-coated reflective permanent substrate as claimed in claim 1, wherein step (C) is accomplished by chemical etching using a hydrochloric acid or a phosphoric acid as an etching agent.

8. The method for manufacturing an LED with a metal-coated reflective permanent substrate as claimed in claim 1, wherein said LED structure has a p/n junction or an n/p junction.

9. The method for manufacturing an LED with a metal-coated reflective permanent substrate as claimed in claim 1, wherein said LED structure includes an etching stop layer.

10. The method for manufacturing an LED with a metal-coated reflective permanent substrate as claimed in claim 9, wherein the material of said etching stop layer is selected from the group of $In_xGa_{1-x}P$ and $Al_xGa_{1-x}As$ with $0.1<x<1$.

11. The method for manufacturing an LED with a metal-coated reflective permanent substrate as claimed in claim 1, wherein step (B) of bonding said LED structure to said permanent substrate by a metal bonding agent further comprises the steps of adhering said LED structure to said permanent substrate by a metal bonding agent in air, water or alcohol, and then placing the adhered structure in a bonding tool for thermal processing.

12. The method for manufacturing an LED with a metal-coated reflective permanent substrate as claimed in claim 11, wherein said thermal processing is performed in a temperature in the range of 300 to 450° C.

13. The method for manufacturing an LED with a metal-coated reflective permanent substrate as claimed in claim 11, wherein the bonding tool used in the thermal processing includes a primary portion made of graphite and a screw made of stainless steel, said graphite portion and said stainless steel screw having different expansion coefficients so that an axial pressure is applied to said LED structure and said permanent substrate to help this two components to combine together.

* * * * *